United States Patent
Lin et al.

(10) Patent No.: US 7,462,894 B2
(45) Date of Patent: Dec. 9, 2008

(54) ELECTRICAL FUSE DEVICE WITH DUMMY CELLS FOR ESD PROTECTION

(75) Inventors: Sung-Chieh Lin, Hsin chu (TW); Hung-Jen Liao, Hsi-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 478 days.

(21) Appl. No.: 11/368,213

(22) Filed: Mar. 2, 2006

(65) Prior Publication Data

US 2007/0206401 A1  Sep. 6, 2007

(51) Int. Cl.
*H01L 29/00* (2006.01)
(52) U.S. Cl. .............................. 257/209; 257/E23.149
(58) Field of Classification Search ................ 257/208, 257/209, 529, E23.149, E23.15
See application file for complete search history.

(56) References Cited

U.S. PATENT DOCUMENTS

2005/0270714 A1* 12/2005 Huang et al. ............... 361/91.1

* cited by examiner

*Primary Examiner*—Evan Pert
*Assistant Examiner*—Leslie Pilar Cruz
(74) *Attorney, Agent, or Firm*—K & L Gates LLP

(57) ABSTRACT

An electrical fuse device includes at least one electrical fuse cell having a first switch device serially coupled with an electrical fuse representing a logic value; and at least one dummy cell having a second switch device coupled to the first switch device via a common word line, the second switch device having a trigger-on voltage lower than that of the first device, such that the second switch becomes conductive earlier than the first switch device for bypassing an electrostatic discharge (ESD) current therethrough during an ESD event.

10 Claims, 4 Drawing Sheets

ELECTRICAL FUSE DEVICE WITH DUMMY CELLS FOR ESD PROTECTION

BACKGROUND

The present invention relates generally to integrated circuit designs, and more particularly to an electrical fuse device with dummy cells for electrostatic discharge (ESD) protection.

Electrical fuse devices are designed for storing data on a one-time programming basis. An electrical fuse cell typically includes an electrical fuse and a switch device, such as an NMOS (N-channel metal-oxide-semiconductor) transistor. The electrical fuse can be selectively programmed to demonstrate a high or low resistance level for representing a logic value. If the fuse is programmed, its resistance will permanently increase. Thus, the electrical fuse device is often referred to as a one-time programming memory device.

The electrical fuse device is particularly susceptible to the influence of an ESD current because of its one-time programming nature. The ESD current can easily reach a voltage level of thousands of volts. When the ESD current enters the electrical fuse device, it can blow many of the electrical fuses. Since the electrical fuse has a one-time programming nature, its resistance will not bounce back after the ESD current dissipates, thereby causing irreparable data errors.

Conventionally, an RC-delay or DC circuit is implemented in the electrical fuse device for turning off the switch device in order to prevent the ESD current from flowing through the electrical fuse during an ESD event. However, the conventional ESD protection mechanism may have certain drawbacks. When an ESD occurs, the ESD current always needs to find a less resistive dissipation path. While the conventional ESD protection mechanism may turn off some current paths, the ESD current may still flow through other less resistive path and cause damages. It is very difficult to predict the ESD current path and design a protection mechanism accordingly. In some cases, the ESD voltage is so high that a punch-through may occur across a switch device that is turned off by the protection mechanism during the ESD event.

As such, what is needed is an electrical fuse device with improved ESD protection designs.

SUMMARY

The present invention discloses an electrical fuse device. In one embodiment of the present invention, the electrical fuse device includes at least one electrical fuse cell having a first switch device serially coupled with an electrical fuse representing a logic value; and at least one dummy cell having a second switch device coupled to the first switch device via a common word line, the second switch device having a trigger-on voltage lower than that of the first device, such that the second switch becomes conductive earlier than the first switch device for bypassing an electrostatic discharge (ESD) current therethrough during an ESD event.

The construction and method of operation of the invention, however, together with additional objectives and advantages thereof will be best understood from the following description of specific embodiments when read in connection with the accompanying drawings.

DESCRIPTION

Figure 1:
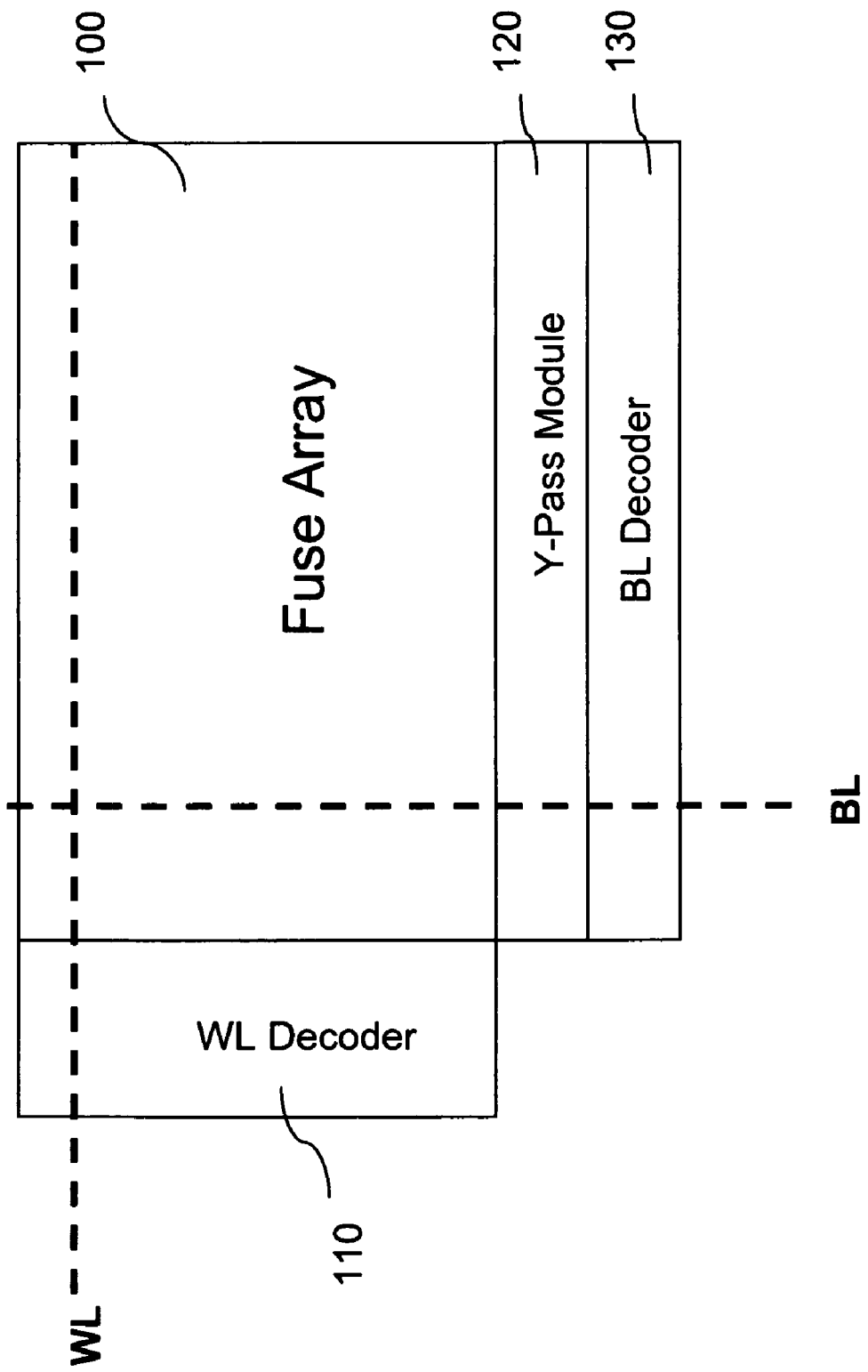
FIG. 1 illustrates a floor plan of a conventional electrical fuse device.

FIG. 1 illustrates a floor plan of a conventional electrical fuse device, which includes a fuse array 100, a word line decoder 110, a Y-pass module 120 and a bit line decoder 130. The fuse array 100 includes a plurality of electrical fuse cells addressed by a number of word lines and bit lines. The word line decoder 110 and the bit line decoder 130 are connected to the word lines and bit lines, respectively, for selecting the electrical fuse cells within the fuse array 100 for programming or reading operations. The Y-pass module 120 is designed for selectively passing the signals between the fuse array 100 and the bit line decoder 130.

Figure 2:
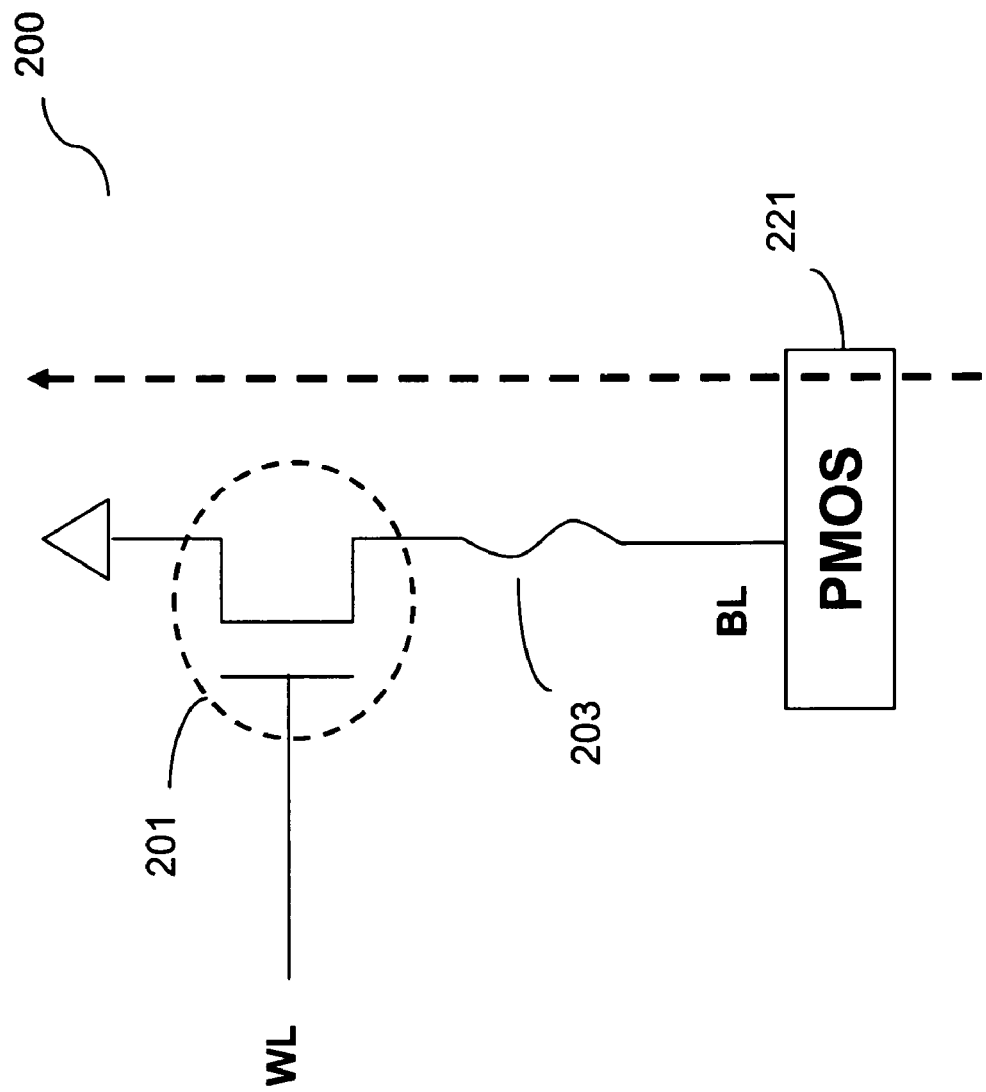
FIG. 2 schematically illustrates an electrical fuse cell within the conventional electrical fuse device.

FIG. 2 schematically illustrates an electrical fuse cell 200 within the fuse array 100 shown in FIG. 1. Referring simultaneously to FIGS. 1 and 2, the cell 200 has a switch device 201, such as an NMOS transistor, serially coupled to an electrical fuse 203, which is further connected to a PMOS transistor 221 disposed in the Y-pass module 120. The gate of the switch device 201 is connected to a word line controlled by the word line decoder 110. The source and drain terminals of the switch device 201 are connected to a bit line controlled by the bit line decoder 130 via the fuse 203 and the PMOS transistor 221.

During an ESD event, the ESD current may dissipate via a current path, such as the bit line BL. The ESD voltage can easily reach thousands of volts, thereby blowing the fuse 203 that is connected to the bit line BL. In some cases where the switch device 201 is turned off, the ESD voltage may still be high enough to cause the switch device 201 a junction break down, thereby blowing the electrical fuse 203 while dissipating through the bit line BL.

Figure 3:
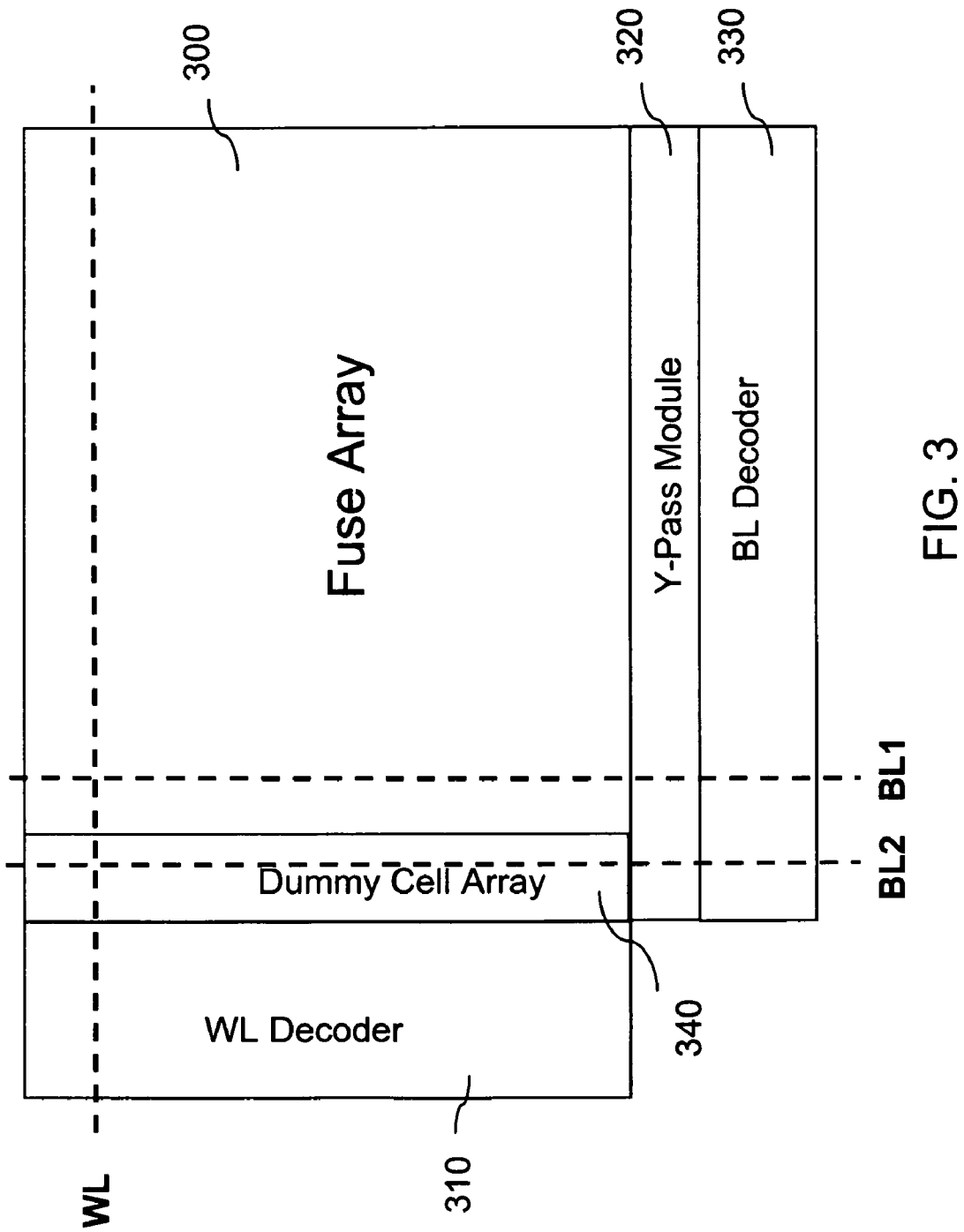
FIG. 3 illustrates a floor plan of an electrical fuse device in accordance with one embodiment of the present invention.

FIG. 3 illustrates a floor plan of an electrical fuse device in accordance with one embodiment of the present invention. The electrical fuse device includes a fuse array 300, word line decoder 310, Y-pass module 320, bit line decoder 330, and dummy cell array 340. The fuse array 300 includes a plurality of electrical fuse cells addressed by a number of word lines and bit lines in an array fashion. For example, an 8×8 fuse array is constructed by 64 fuse cells arranged in eight rows of word lines by eight columns of bit lines. The. word line decoder 310 and the bit line decoder 330 are connected to the word lines and bit lines, respectively, for selecting the cells within the fuse array 100 for programming or reading operations. The Y-pass module 320 is designed for selectively passing the signals between the fuse array 300 and the bit line decoder 330.

The dummy cell array 340 is coupled to the word lines connected to the fuse cells in the fuse array 300, and one or more bit lines that are unconnected to the fuse cells in the fuse array 300. When the word line decoder 310 selects a word line, at least one dummy cell and one number of fuse cells that are connected to the word line are selected. When the bit line decoder 330 selects a bit line, it selects either a column of fuse cells or a column of dummy cells. The dummy cell array 340 is placed between the fuse array 300 and the word line decoder 310 along a bit line BL2. However, it is noteworthy that the dummy cell array 340 can be disposed at other locations as long as it does not share the same bit line with the fuse array 300.

The dummy cell array 340 includes one or more dummy cells, each of which is essentially a switch device without being connected to any electrical fuse. Similar to the fuse cells, the dummy cells are controlled by the signals generated by the word line decoder 310 and the bit line decoder 330. However, since the dummy cell does not have an electrical fuse, it cannot be programmed or read as the fuse cell. Thus, the implementation of dummy cell array 340 does not affect the normal operation of the fuse array 300.

The dummy cells are designed to be weaker than the fuse cells. When both the switch device of the dummy cell and the switch of the fuse cell are turned off, the prior is easier to be trigger-on than the latter for conducting current. This allows the dummy cell to become conductive earlier than the fuse cell when an ESD occurs. Thus, the ESD current would dissipate through the dummy cells, and therefore spare the fuse cells from ESD induced damages. For example, when an ESD occurs, the dummy cells connected to the bit line BL2 are trigged on earlier than the fuse cells connected to the bit line BL1. Thus, the ESD current would dissipate through the path BL2, instead of BL1, thereby protecting the fuse cells in the fuse array 300 from ESD induced damages.

Figure 4:
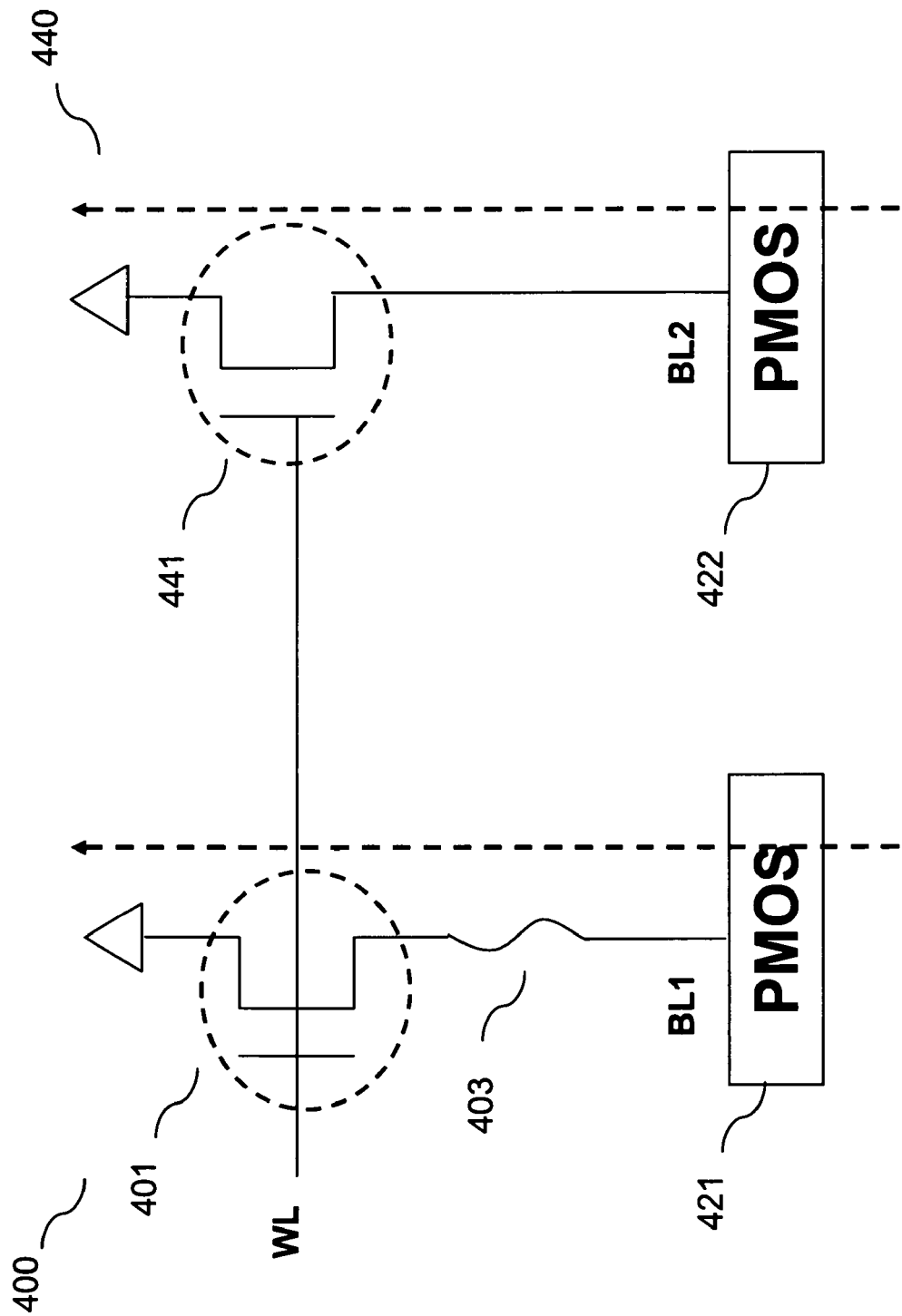
FIG. 4 schematically illustrates an electrical fuse cell and dummy fuse within the electrical fuse device in accordance with one embodiment of the present invention.

FIG. 4 schematically illustrates an electrical fuse cell 400 and a dummy cell 440 within the electrical fuse device in accordance with one embodiment of the present invention. The electrical fuse cell 400 includes a switch device, such as an NMOS transistor 401, an electrical fuse 403 and a PMOS transistor 421. The source terminal of the switch device 401 is connected to a voltage source, while its drain terminal is connected to the PMOS transistor 421 through the electrical fuse 403. The dummy cell 440 includes a switch device 441, such as an NMOS transistor, and a PMOS transistor 422. The source terminal of the switch device 441 is connected to a voltage source, while its drain terminal is connected to the PMOS transistor 422. The gate terminals of the switch devices 401 and 441 are connected together to a common word line WL. The fuse cell 401 and the dummy cell 440 are connected to separate bit lines BL1 and BL2.

The switch device 441 is designed to be weaker than the switch device 401. For example, the switch device 441 can be designed to have a trigger-on voltage lower than that of the switch device 401. As another example, the channel width of the dummy cell 441 can be designed to be shorter than that of the fuse cell 401.

With a lower trigger-on voltage, the dummy cell 441 becomes conductive earlier than the fuse cell 401 when the ESD current enters the electrical fuse device. Thus, the ESD current can dissipate via the dummy cell 441 through the bit line BL2, and the fuse cell 401 can be protected from ESD induced damages. The dummy cells can be easily implemented in electrical fuse devices manufactured by technologies of various generations at minimal costs. The manufacturing process of the dummy cells can be incorporated in the process of manufacturing the fuse cells. As such, the proposed dummy cell array can be an effective and efficient solution for fuse cell ESD protection.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An electrical fuse device comprising:
   at least one electrical fuse cell having a first switch device serially coupled with an electrical fuse representing a logic value; and
   at least one dummy cell having a second switch device coupled to the first switch device via a common word line, the second switch device having a trigger-on voltage lower than that of the first device, such that the second switch becomes conductive earlier than the first switch device for bypassing an electrostatic discharge (ESD) current therethrough during an ESD event.

2. The electrical fuse device of claim 1 wherein the first and second switch devices are NMOS transistors.

3. The electrical fuse device of claim 2 wherein the first switch device has a channel width greater than that of the second switch device.

4. A one-time programming memory device comprising:
   at least one electrical fuse array having one or more electrical fuse cells, each of which has a first switch device serially coupled to an electrical fuse, addressed by one or more word lines and bit lines;
   one or more decoders coupled to the word lines and bit lines for selecting the electrical fuse cells; and
   at least one dummy cell array having one or more dummy cells, each of which has a second switch device, addressed by the word lines connected to the electrical fuse cells and one or more bit lines unconnected to the electrical fuse cells,
   wherein the second switch device has a trigger-on voltage lower than that of the first device, such that the second switch becomes conductive earlier than the first switch device for bypassing an electrostatic discharge (ESD) current therethrough during an ESD event.

5. The one-time programming device of claim 4 wherein the first and second switch devices are NMOS transistors.

6. The one-time programming device of claim 4 wherein the first switch device has a channel width greater than that of the second switch device.

7. The one-time programming device of claim 4 wherein the decoders comprise a word line decoder for selecting the word lines connected to the dummy cells and the electrical fuse cells.

8. The one-time programming device of claim 4 wherein the decoders comprise a bit line decoder for selecting the bit lines connected to the dummy cells and the electrical fuse cells.

9. An integrated circuit comprising:
   at least one electrical fuse array having one or more electrical fuse cells, each of which has a first switch device serially coupled to an electrical fuse, addressed by one or more word lines and bit lines;
   at least one dummy cell array having one or more dummy cells, each of which has a second switch device, addressed by the word lines connected to the electrical fuse cells and one or more bit lines unconnected to the electrical fuse cells;
   at least one word line decoder for selecting the word lines connected to the dummy cells and the electrical fuse cells; and at least one bit line decoder for selecting the bit lines
connected to the dummy cells and the electrical fuse
cells,
wherein the second switch device has a trigger-on voltage
lower than that of the first device, such that the second
switch becomes conductive earlier than the first switch
device for bypassing an electrostatic discharge (ESD)
current therethrough during an ESD event.

10. The integrated circuit of claim 9 wherein the first and second switch devices are NMOS transistors.

* * * * *